(12) United States Patent
Nishino et al.

(10) Patent No.: US 8,470,513 B2
(45) Date of Patent: Jun. 25, 2013

(54) RADIATION-SENSITIVE RESIN COMPOSITION AND POLYMER

(75) Inventors: Kota Nishino, Tokyo (JP); Ken Maruyama, Tokyo (JP); Daisuke Shimizu, Tokyo (JP); Toshiyuki Kai, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/242,920

(22) Filed: Sep. 23, 2011

(65) Prior Publication Data

US 2012/0058429 A1    Mar. 8, 2012

Related U.S. Application Data

(63) Continuation of application No. PCT/JP2010/054922, filed on Mar. 23, 2010.

(30) Foreign Application Priority Data

Mar. 27, 2009  (JP) ................................. 2009-080223

(51) Int. Cl.
*C08F 228/00*    (2006.01)
(52) U.S. Cl.
USPC ........ 430/270.1; 430/907; 430/910; 430/921; 430/925; 526/242; 526/243; 526/245; 526/251; 526/287
(58) Field of Classification Search
USPC .............. 430/270.1, 906, 907, 910, 921, 922, 430/925, 923; 526/242, 245, 287, 318, 243, 526/251
See application file for complete search history.

(56) References Cited

U.S. PATENT DOCUMENTS

| 6,794,110 B2 * | 9/2004 | Breyta et al. ............... 430/270.1 |
| 2007/0149702 A1 | 6/2007 | Ando et al. |
| 2008/0102407 A1 * | 5/2008 | Ohsawa et al. ............ 430/286.1 |
| 2009/0069521 A1 | 3/2009 | Nagai et al. |

(Continued)

FOREIGN PATENT DOCUMENTS

| CN | 101003591 | 7/2007 |
| EP | 1897869 | 3/2008 |

(Continued)

OTHER PUBLICATIONS

International Search Report for International Application No. PCT/2010/054922, Apr. 27, 2010.

*Primary Examiner* — Anca Eoff
(74) *Attorney, Agent, or Firm* — Ditthavong Mori & Steiner, P.C.

(57) ABSTRACT

A radiation-sensitive resin composition includes a polymer that includes at least one repeating unit (i) selected from a repeating unit shown by a formula (1), (2), and (3); and a repeating unit (ii) shown by a formula (4).

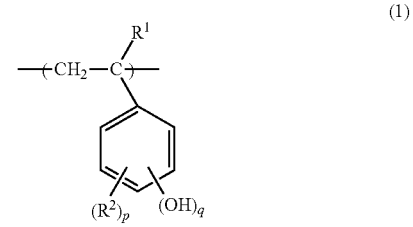

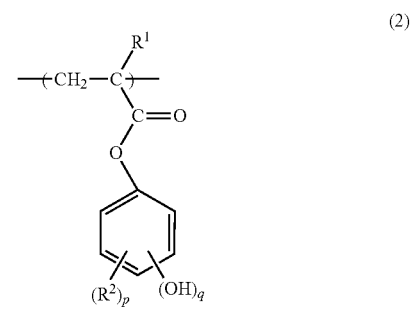

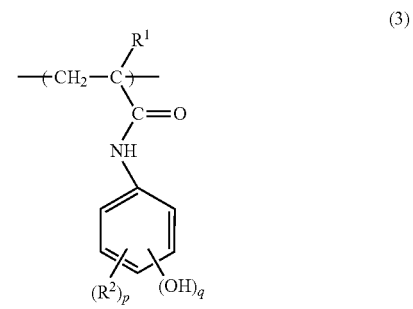

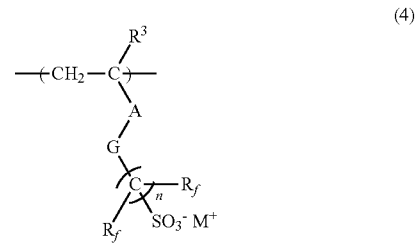

$R^1$ represents a hydrogen atom or a methyl group. Each $R^2$ independently represents one of a linear or branched alkyl group having 1 to 12 carbon atoms, a linear or branched alkoxy group having 1 to 12 carbon atoms, and an alicyclic hydrocarbon group having 3 to 25 carbon atoms. p is an integer from 0 to 3, and q is an integer from 1 to 3, and $p+q \leq 5$. A chemically-amplified positive-tone resist film that is sensitive to extreme ultraviolet rays (EUV) can be formed using the radiation-sensitive resin composition.

6 Claims, 1 Drawing Sheet

U.S. PATENT DOCUMENTS

| | | | |
|---|---|---|---|
| 2009/0202943 A1 | 8/2009 | Ohsawa et al. | |
| 2009/0269696 A1* | 10/2009 | Ohsawa et al. | 430/270.1 |
| 2010/0040977 A1 | 2/2010 | Nagai et al. | |
| 2011/0159429 A1* | 6/2011 | Thackeray et al. | 430/270.1 |
| 2011/0159433 A1* | 6/2011 | Takahashi et al. | 430/286.1 |

FOREIGN PATENT DOCUMENTS

| | | |
|---|---|---|
| EP | 2080774 | 7/2009 |
| EP | 2088467 | 8/2009 |
| EP | 2090931 | 8/2009 |
| JP | 06-12452 B2 | 5/1984 |
| JP | 59-93448 | 5/1984 |
| JP | 04-230645 | 8/1992 |
| JP | 05-188598 | 7/1993 |
| JP | 3613491 B2 | 12/1997 |
| JP | 2005-84365 | 3/2005 |
| JP | 2006-178317 | 7/2006 |
| JP | 2007-197718 | 8/2007 |
| JP | 2008-133448 | 6/2008 |
| JP | 2009-217253 | 9/2009 |
| KR | 10-2007-0069068 | 7/2007 |
| KR | 10-2008-0008415 | 1/2008 |
| KR | 10-2008-0038049 | 5/2008 |
| KR | 10-2009-0077832 | 7/2009 |
| KR | 10-2009-0077962 | 7/2009 |
| KR | 10-2009-0087829 | 8/2009 |
| WO | WO 2006/121096 | 11/2006 |
| WO | WO 2008/056795 | 5/2008 |
| WO | WO 2008/056796 | 5/2008 |
| WO | WO 2009/019793 | 2/2009 |

* cited by examiner

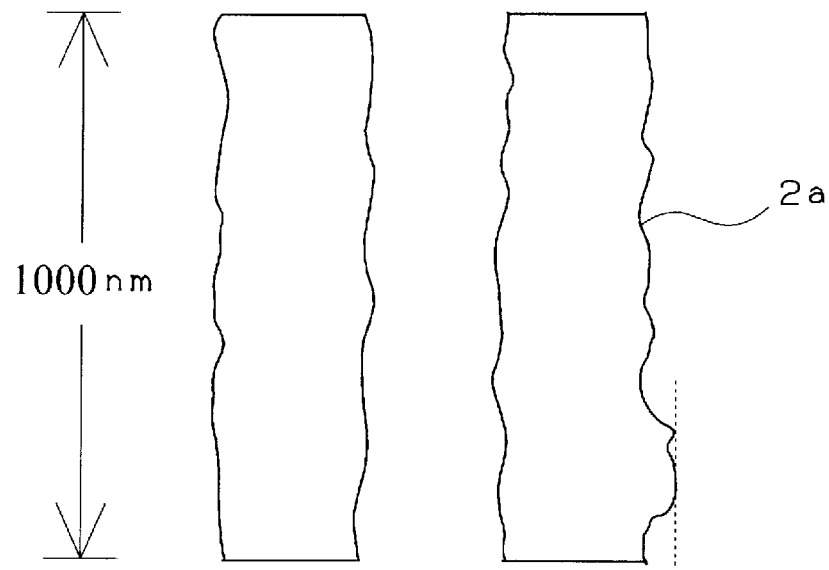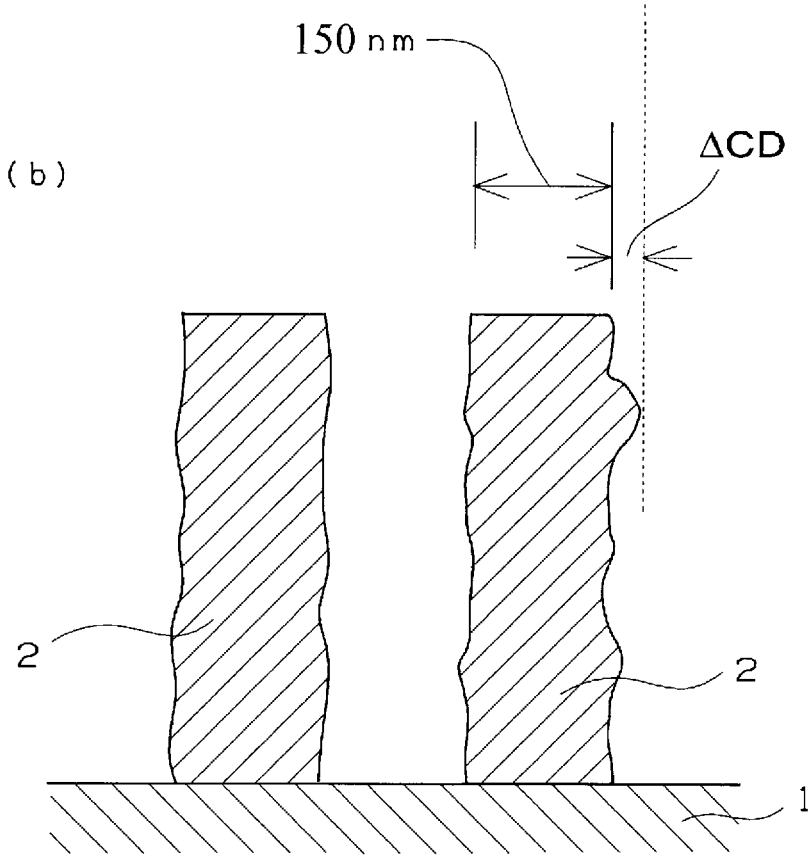

RADIATION-SENSITIVE RESIN COMPOSITION AND POLYMER

CROSS-REFERENCE TO RELATED APPLICATIONS

The present application is a continuation application of International Application No. PCT/JP2010/054922, filed Mar. 23, 2010, which claims priority under 35 U.S.C. §119 to Japanese Patent Application No. 2009-080223, filed Mar. 27, 2009. The contents of these applications are incorporated herein by reference in their entirety.

BACKGROUND OF THE INVENTION

1. Field of the Invention

The invention relates to a radiation-sensitive resin composition and a polymer.

2. Discussion of the Background

A semiconductor device (e.g., IC or LSI) production process utilizes microfabrication by means of lithography using a photoresist composition. Along with an increase in the degree of integration of integrated circuits, the semiconductor device production process has been required to form a sub-micrometer or quarter-micrometer fine pattern. Therefore, i-lines, KrF excimer laser light, or ArF excimer laser light having a short exposure wavelength has been used instead of g-lines. Lithography that utilizes electron beams, X-rays, or EUV light instead of excimer laser light has also been developed.

Lithography that utilizes EUV light is considered to be next-generation or third-generation patterning technology, and requires a positive-tone resist that exhibits high sensitivity and high resolution. In particular, an increase in sensitivity is very important for reducing the wafer processing time. However, when increasing the sensitivity of a positive-tone resist used for EUV light, a deterioration in resolution and nano edge roughness occurs. Therefore, development of a resist that achieves high sensitivity, high resolution, and low nano edge roughness has been strongly desired. Note that the term "nano edge roughness" refers to a phenomenon in which the edge of the resist pattern irregularly changes with respect to the substrate in the direction perpendicular to the line direction due to the properties of the resist, so that a difference occurs between the design dimensions and the actual pattern dimensions when viewed from above. The difference from the design dimensions is transferred by etching using the resist as a mask, and causes a deterioration in electrical properties. As a result, a decrease in yield occurs. In particular, it is very important to reduce the nano edge roughness when forming a fine pattern having a line width of 32 nm or less using EUV light. High sensitivity, high resolution, an excellent pattern shape, and low nano edge roughness have a trade-off relationship. It is very important to achieve these properties at the same time.

A polymer compound that includes an acryloyloxyphenylsulfonium salt as a monomer has been proposed in order to improve the sensitivity (see Japanese Patent Application Publication (KOKAI) No. 4-230645), and the above monomer may be incorporated in a base resin in order to reduce the line edge roughness when using a polyhydroxystyrene resin (see Japanese Patent Application Publication (KOKAI) No. 2005-84365).

A sulfonium salt in which the anion moiety is incorporated in the polymer main chain (e.g., polystyrenesulfonic acid) has been proposed in order to improve the sensitivity and the resist pattern shape (see Japanese Patent No. 3613491).

An acrylic acid derivative that includes a sulfonic acid anion (e.g., —$CF_2$—$SO_3$— group) in the side chain has been proposed (see Japanese Patent Application Publication (KOKAI) No. 2006-178317).

SUMMARY OF THE INVENTION

According to one aspect of the present invention, a radiation-sensitive resin composition includes a solvent and a polymer. The polymer includes at least one repeating unit (i) selected from a repeating unit shown by a formula (1), a repeating unit shown by a formula (2), and a repeating unit shown by a formula (3), and a repeating unit (ii) shown by a formula (4).

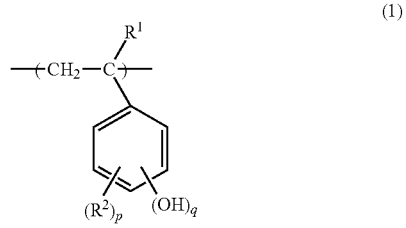

(1)

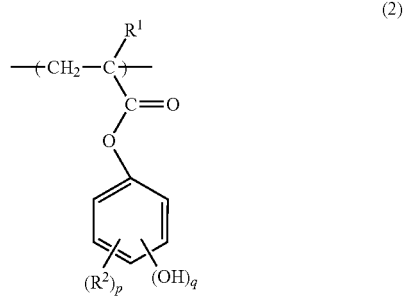

(2)

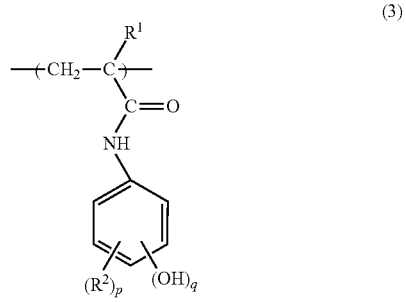

(3)

p is an integer from 0 to 3. q is an integer from 1 to 3. A sum of p and q is equal to or less than 5. $R^1$ represents a hydrogen atom or a methyl group. Each $R^2$ independently represents one of a linear or branched alkyl group having 1 to 12 carbon atoms, a linear or branched alkoxy group having 1 to 12 carbon atoms, and an alicyclic hydrocarbon group having 3 to 25 carbon atoms. Each $R^2$ is a same as or different from each other when p is 2 or 3.

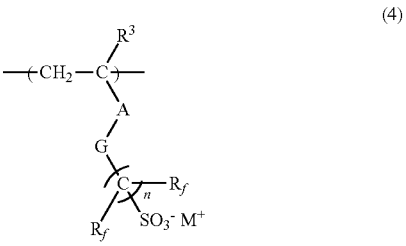

(4)

$R^3$ represents a hydrogen atom, a fluorine atom, a methyl group, or a trifluoromethyl group. Each $R_f$ independently represents one of a fluorine atom and a linear or branched perfluoroalkyl group having 1 to 10 carbon atoms. Each $R_f$ is a same as or different from each other. A represents an ester bond or a single bond. G represents an alkylene group having 1 to 5 carbon atoms or a divalent alicyclic hydrocarbon group having 6 to 10 carbon atoms. $M^+$ represents a metal ion or a monovalent onium cation, and n is an integer from 1 to 8.

According to another aspect of the present invention, a polymer includes at least one repeating unit (i) selected from a repeating unit shown by a formula (1), a repeating unit shown by a formula (2), and a repeating unit shown by a formula (3), a repeating unit (ii) shown by a formula (4), at least one repeating unit (iii) selected from a repeating unit shown by a formula (5) and a repeating unit shown by a formula (6), and an acid-dissociable group-containing repeating unit shown by a formula (7). The polymer has a polystyrene-reduced weight average molecular weight determined by gel permeation chromatography of 3000 to 100,000.

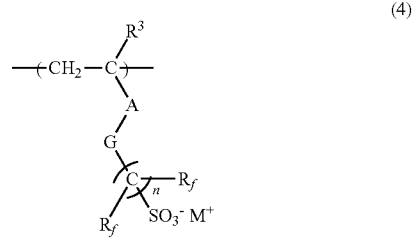

(4)

$R^3$ represents a hydrogen atom, a fluorine atom, a methyl group, or a trifluoromethyl group. Each $R_f$ independently represents of a fluorine atom and a linear or branched perfluoroalkyl group having 1 to 10 carbon atoms. Each $R_f$ is a same as or different from each other. A represents an ester bond or a single bond. G represents an alkylene group having 1 to 5 carbon atoms or a divalent alicyclic hydrocarbon group having 6 to 10 carbon atoms. $M^+$ represents a metal ion or a monovalent onium cation. n is an integer from 1 to 8.

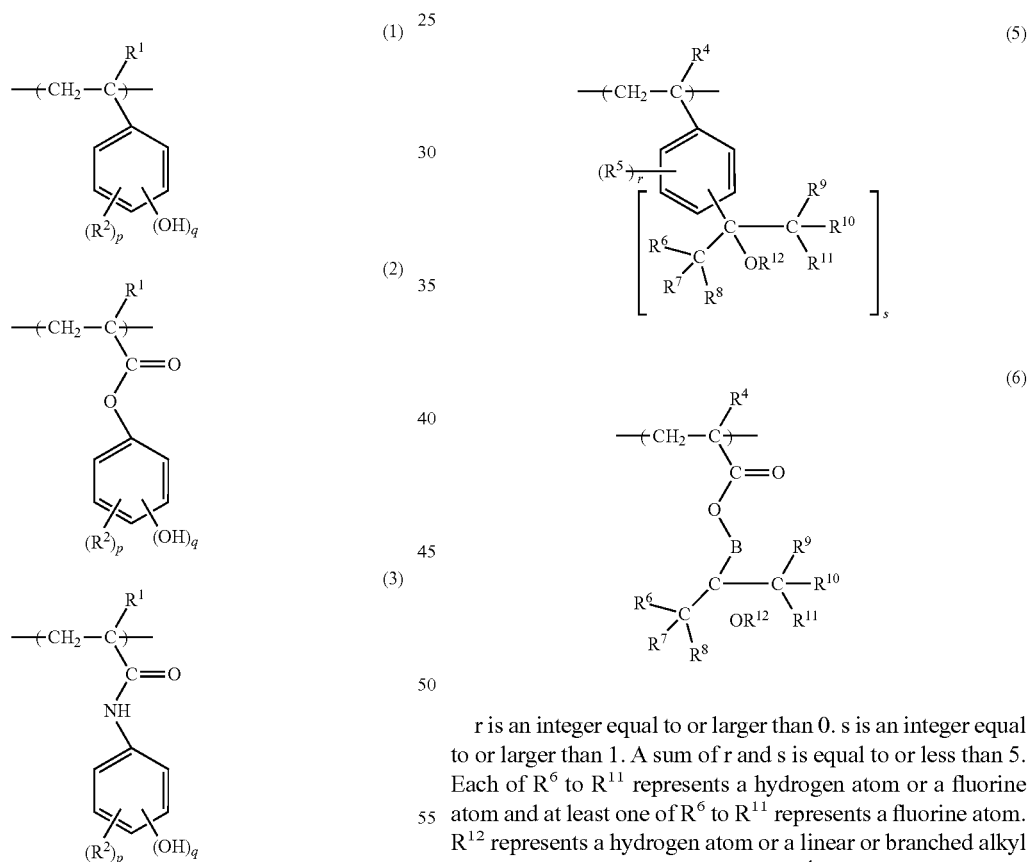

p is an integer from 0 to 3. q is an integer from 1 to 3. A sum of p and q is equal to or less than 5. $R^1$ represents a hydrogen atom or a methyl group. Each $R^2$ independently represents one of a linear or branched alkyl group having 1 to 12 carbon atoms, a linear or branched alkoxy group having 1 to 12 carbon atoms, and an alicyclic hydrocarbon group having 3 to 25 carbon atoms. Each $R^2$ is a same as or different from each other when p is 2 or 3.

r is an integer equal to or larger than 0. s is an integer equal to or larger than 1. A sum of r and s is equal to or less than 5. Each of $R^6$ to $R^{11}$ represents a hydrogen atom or a fluorine atom and at least one of $R^6$ to $R^{11}$ represents a fluorine atom. $R^{12}$ represents a hydrogen atom or a linear or branched alkyl group having 1 to 12 carbon atoms. $R^4$ represents a hydrogen atom or a methyl group. Each $R^5$ independently represents one of a linear or branched alkyl group having 1 to 12 carbon atoms, a linear or branched alkoxy group having 1 to 12 carbon atoms, and an alicyclic hydrocarbon group having 3 to 25 carbon atoms. Each $R^5$ is a same as or different from each other when r is 2 or more. $R^{13}$ represents a hydrogen atom, a fluorine atom, a methyl group, or a trifluoromethyl group. B represents a linear, branched, or cyclic divalent hydrocarbon group having 1 to 40 carbon atoms.

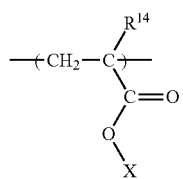

(7)

$R^{14}$ represents a hydrogen atom, a methyl group, or a trifluoromethyl group. X represents an acid-dissociable group including an alicyclic skeleton having 3 to 25 carbon atoms.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 1 is a view schematically showing the shape of a line-and-space pattern.

DESCRIPTION OF THE EMBODIMENTS

According to one embodiment of the invention, there is provided a radiation-sensitive resin composition including (A) a polymer and (D) a solvent, the polymer (A) including at least one repeating unit (i) selected from a repeating unit shown by a formula (1), a repeating unit shown by a formula (2), and a repeating unit shown by a formula (3), and a repeating unit (ii) shown by a formula (4),

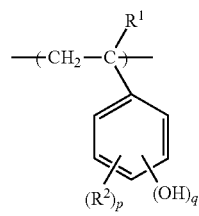

(1)

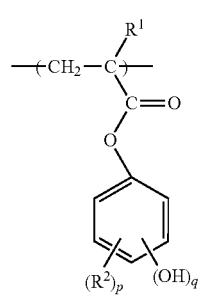

(2)

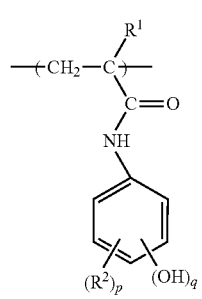

(3)

wherein $R^1$ represents a hydrogen atom or a methyl group, $R^2$ individually represents a linear or branched alkyl group having 1 to 12 carbon atoms, a linear or branched alkoxy group having 1 to 12 carbon atoms, or an alicyclic hydrocarbon group having 3 to 25 carbon atoms, p is an integer from 0 to 3, and q is an integer from 1 to 3, provided that "p+q≦5" is satisfied,

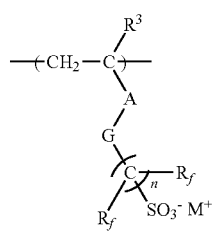

(4)

wherein $R^3$ represents a hydrogen atom, a fluorine atom, a methyl group, or a trifluoromethyl group, $R_f$ individually represent a fluorine atom or a linear or branched perfluoroalkyl group having 1 to 10 carbon atoms, A represents an ester bond or a single bond, G represents an alkylene group having 1 to 5 carbon atoms or a divalent alicyclic hydrocarbon group having 6 to 10 carbon atoms, $M^+$ represents a metal ion or a monovalent onium cation, and n is an integer from 1 to 8.

The repeating unit (ii) may be shown by a formula (4-1) or (4-2).

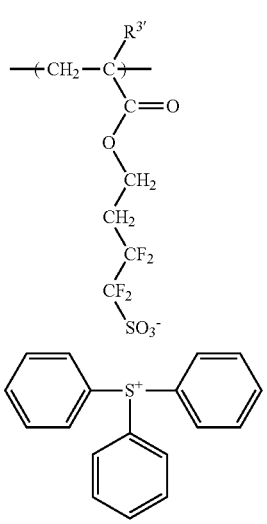

(4-1)

-continued

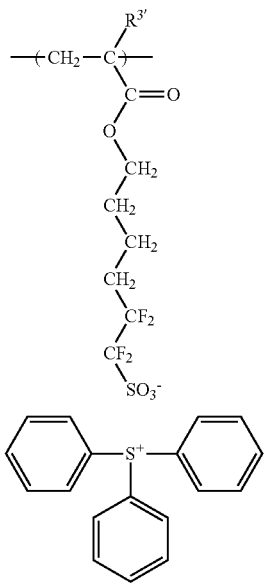
(4-2)

wherein R³' represents a hydrogen atom or a methyl group.

The polymer may further include at least one repeating unit (iii) selected from a repeating unit shown by a formula (5) and a repeating unit shown by a formula (6).

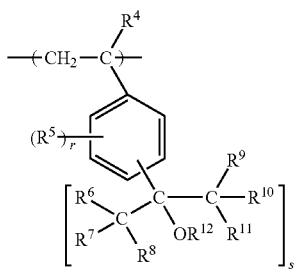
(5)

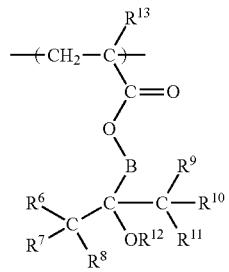
(6)

wherein $R^6$ to $R^{11}$ individually represent a hydrogen atom or a fluorine atom, provided that at least one of $R^6$ to $R^{11}$ represents a fluorine atom, $R^{12}$ represents a hydrogen atom or a linear or branched alkyl group having 1 to 12 carbon atoms, $R^4$ represents a hydrogen atom or a methyl group, $R^5$ individually represents a linear or branched alkyl group having 1 to 12 carbon atoms, a linear or branched alkoxy group having 1 to 12 carbon atoms, or an alicyclic hydrocarbon group having 3 to 25 carbon atoms, r is an integer equal to or larger than 0, s is an integer equal to or larger than 1, provided that "r+s≦5" is satisfied, $R^{13}$ represents a hydrogen atom, a fluorine atom, a methyl group, or a trifluoromethyl group, and B represents a linear, branched, or cyclic divalent hydrocarbon group having 1 to 40 carbon atoms.

The polymer may include an acid-dissociable group-containing repeating unit shown by a formula (7).

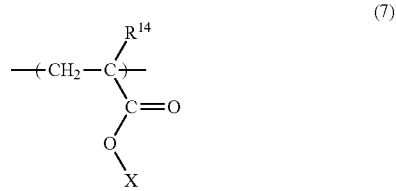
(7)

wherein $R^{14}$ represents a hydrogen atom, a methyl group, or a trifluoromethyl group, and X represents an acid-dissociable group including an alicyclic skeleton and having 3 to 25 carbon atoms.

According to another embodiment of the invention, there is provided a polymer including at least one repeating unit (i) selected from a repeating unit shown by the formula (1), a repeating unit shown by the formula (2), and a repeating unit shown by the formula (3), a repeating unit (ii) shown by the formula (4), at least one repeating unit (iii) selected from a repeating unit shown by the formula (5) and a repeating unit shown by the formula (6), and an acid-dissociable group-containing repeating unit shown by the formula (7), the polymer having a polystyrene-reduced weight average molecular weight determined by gel permeation chromatography of 3000 to 100,000.

The above radiation-sensitive resin composition exhibits excellent sensitivity since the polymer (resin component) includes at least one repeating unit (i) selected from a repeating unit shown by the formula (1), a repeating unit shown by the formula (2), and a repeating unit shown by the formula (3), and the repeating unit (ii) shown by the formula (4). Therefore, the radiation-sensitive resin composition can form a chemically-amplified positive-tone resist film that is sensitive to extreme ultraviolet rays or electron beams during a lithographic process used to form a sub-micrometer or quarter-micrometer pattern, exhibits low nano edge roughness, excellent etching resistance, and high sensitivity, and can stably form an accurate fine pattern.

The embodiments will now be described with reference to the accompanying drawings, wherein like reference numerals designate corresponding or identical elements throughout the various drawings.

A radiation-sensitive resin composition according to one embodiment of the invention includes the polymer (A). The polymer (A) is insoluble or scarcely soluble in alkali, but becomes readily soluble in alkali upon exposure to radiation. The expression "insoluble or scarcely soluble in alkali" means that a film (thickness: 100 nm) formed only of the polymer (A) has a thickness equal to or more than 50% of the initial thickness when developed without applying extreme ultraviolet rays under alkaline development conditions employed when forming a resist pattern by applying extreme ultraviolet rays to a resist film that is formed using a radiation-sensitive resin composition that includes the polymer (A).

The polymer (A) includes at least one repeating unit (i) selected from a repeating unit shown by the formula (1), a repeating unit shown by the formula (2), and a repeating unit shown by the formula (3), and a repeating unit (ii) shown by the formula (4). The polymer (A) may further include at least one repeating unit (iii) selected from a repeating unit shown by the formula (5) and a repeating unit shown by the formula (6).

The polymer (A) is insoluble or scarcely soluble in alkali, but becomes readily soluble in alkali upon exposure to radiation, and may suitably be used as a resin component included in the radiation-sensitive resin composition.

Repeating Unit (i)

The repeating unit (i) is a repeating unit shown by the formula (1), a repeating unit shown by the formula (2), a repeating unit shown by the formula (3), a repeating unit that includes two of a repeating unit shown by the formula (1), a repeating unit shown by the formula (2), and a repeating unit shown by the formula (3), or a repeating unit that includes a repeating unit shown by the formula (1), a repeating unit shown by the formula (2), and a repeating unit shown by the formula (3).

Examples of the linear or branched alkyl group having 1 to 12 carbon atoms represented by $R^2$ in the formulas (1), (2), and (3) include a methyl group, an ethyl group, an n-propyl group, an i-propyl group, an n-butyl group, a 2-methylpropyl group, a 1-methylpropyl group, a t-butyl group, and the like.

Examples of the linear or branched alkoxy group having 1 to 12 carbon atoms include a methoxy group, an ethoxy group, an n-propoxy group, an i-propoxy group, an n-butoxy group, a 1-methylpropoxy group, a 2-methylpropoxy group, a t-butoxy group, and the like.

Examples of the alicyclic hydrocarbon group having 3 to 25 carbon atoms include cycloalkyl groups such as a cyclopentyl group, a cyclohexyl group, a cycloheptyl group, a cyclooctyl group, a cyclodecanyl group, and a cyclododecanyl group; an adamantyl group, a noradamantyl group, a decalin residue, a tricyclodecanyl group, a tetracyclododecanyl group, a norbornyl group, a cedrol group, and the like.

Among these, a methyl group, an ethyl group, an n-butyl group, and a t-butyl group are preferable as $R^2$.

When a plurality of $R^2$ are present, the plurality of $R^2$ may be the same or different.

p is an integer from 0 to 3, and preferably 0 or 1. q is an integer from 1 to 3, and preferably 1 or 2.

Specific examples of a repeating unit shown by the formula (1) include repeating units shown by the following formulas (1-1) to (1-4). When the polymer (A) includes a repeating unit shown by the formula (1), the polymer (A) may include only one type of repeating unit shown by the formula (1), or may include two or more types of repeating unit shown by the formula (1).

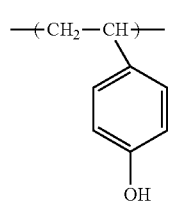

(1-1)

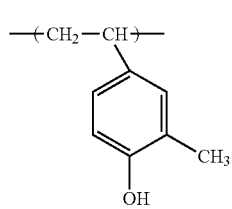

(1-2)

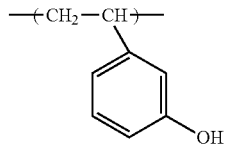

(1-3)

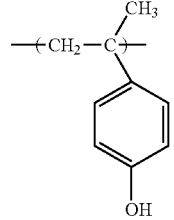

(1-4)

Specific examples of a repeating unit shown by the formula (2) include repeating units shown by the following formulas (2-1) and (2-2). When the polymer (A) includes a repeating unit shown by the formula (2), the polymer (A) may include only one type of repeating unit shown by the formula (2), or may include two or more types of repeating unit shown by the formula (2).

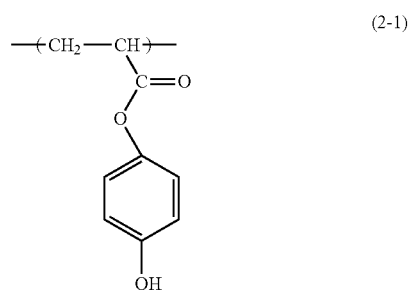

(2-1)

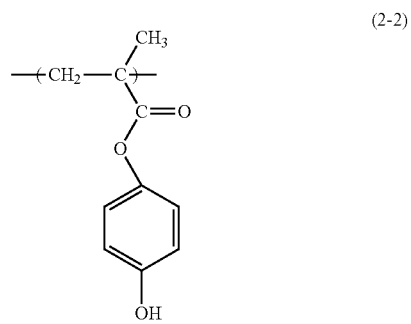

(2-2)

Specific examples of a repeating unit shown by the formula (3) include repeating units shown by the following formulas (3-1) and (3-2). When the polymer (A) includes a repeating unit shown by the formula (3), the polymer (A) may include only one type of repeating unit shown by the formula (3), or may include two or more types of repeating unit shown by the formula (3).

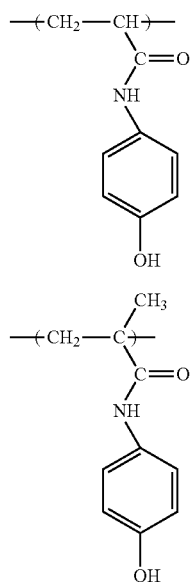

The repeating units shown by the formulas (1-1) to (1-3) may be obtained using the corresponding hydroxystyrene derivative as a monomer. The repeating units shown by the formulas (1-1) to (1-3) may also be obtained using a compound that produces the corresponding hydroxystyrene derivative via hydrolysis as a monomer.

p-Acetoxystyrene, p-(1-ethoxyethoxy)styrene, and the like are preferable as the monomers used to produce the repeating units shown by the formulas (1-1) to (1-3). When using these monomers, the repeating units shown by the formulas (1-1) to (1-3) may be produced by polymerizing the monomers, and hydrolyzing the side chain of the resulting polymer.

The repeating units shown by the formulas (1-4), (2-1), (2-2), (3-1), and (3-2) may be obtained using the corresponding monomer that includes a polymerizable unsaturated bond.

The monomers used to produce the repeating units shown by the formulas (1-4), (2-1), (2-2), (3-1), and (3-2) are preferably p-isopropenylphenol, 4-hydroxyphenyl acrylate, 4-hydroxyphenyl methacrylate, N-(4-hydroxyphenyl)acrylamide, N-(4-hydroxyphenyl)methacrylamide, or the like.

The content of the repeating unit (i) in the polymer (A) is preferably 10 to 80 mol %, more preferably 10 to 50 mol %, and particularly preferably 20 to 50 mol %, based on the total amount (=100 mol %) of the repeating units included in the polymer (A). If the content of the repeating unit (i) is less than 10 mol %, the adhesion of the resist pattern to the substrate may decrease. If the content of the repeating unit (i) exceeds 80 mol %, contrast after development may decrease.

Repeating Unit (ii)

The repeating unit (ii) is shown by the formula (4).

Examples of the linear or branched perfluoroalkyl group having 1 to 10 carbon atoms represented by $R_f$ include linear perfluoroalkyl groups such as a trifluoromethyl group, a pentafluoroethyl group, a heptafluoropropyl group, a nonafluorobutyl group, an undecafluoropentyl group, a tridecafluorohexyl group, a pentadecafluoroheptyl group, a heptadecafluorooctyl group, a nonadecafluorononyl group, and a heneicosadecyl group, and branched perfluoroalkyl groups such as a (1-trifluoromethyl)tetrafluoroethyl group, a (1-trifluoromethyl)hexafluoropropyl group, and a 1,1-bistrifluoromethyl-2,2,2-trifluoroethyl group.

It is preferable that $R_f$ represent a fluorine atom or a trifluoromethyl group, and n be 1 or 2 so that excellent resolution is obtained.

Examples of the alkylene group having 1 to 5 carbon atoms represented by G in the formula (4) include a methylene group, an ethylene group, a propylene group, a butylene group, and the like. Examples of the divalent alicyclic hydrocarbon group having 6 to 10 carbon atoms represented by G in the formula (4) include a bicyclo[2.2.1]heptylene group, a tricyclo[3.3.1.1$^{3,7}$]decylene group, and the like.

Examples of the metal ion represented by $M^+$ in the formula (4) include alkali metal ions such as a sodium ion, a potassium ion, and a lithium ion, alkaline-earth metal ions such as a magnesium ion and a calcium ion, an iron ion, an aluminum ion, and the like. Among these, a sodium ion, a potassium ion, and a lithium ion are preferable since the sulfonate can be easily ion-exchanged.

Examples of the monovalent onium cation include a sulfonium cation, an iodonium cation, a phosphonium cation, a diazonium cation, an ammonium cation, a pyridinium cation, and the like. Among these, a sulfonium cation shown by the following formula (4a) and an iodonium cation shown by the following formula (4b) are preferable.

$R^{15}$, $R^{16}$, and $R^{17}$ in the formula (4a) individually represent a substituted or unsubstituted alkyl group having 1 to 10 carbon atoms or a substituted or unsubstituted aryl group having 6 to 18 carbon atoms, provided that two or more of $R^{15}$, $R^{16}$, and $R^{17}$ may bond to form a ring together with the sulfur atom in the formula (4a).

$R^{18}$ and $R^{19}$ in the formula (4b) individually represent a substituted or unsubstituted alkyl group having 1 to 10 carbon atoms or a substituted or unsubstituted aryl group having 6 to 18 carbon atoms, provided that $R^{18}$ and $R^{19}$ may bond to form a ring together with the iodine atom in the formula (4b).

Examples of the unsubstituted alkyl group having 1 to 10 carbon atoms include linear or branched alkyl groups such as a methyl group, an ethyl group, an n-propyl group, an i-propyl group, an n-butyl group, a 1-methylpropyl group, a 2-methylpropyl group, a t-butyl group, an n-pentyl group, an i-pentyl group, a 1,1-dimethylpropyl group, a 1-methylbutyl group, an n-hexyl group, an i-hexyl group, a 1,1-dimethylbutyl group, an n-heptyl group, an n-octyl group, an i-octyl group, a 2-ethylhexyl group, an n-nonyl group, and an n-decyl group.

Examples of a substituent for the alkyl group include an aryl group having 6 to 30 carbon atoms, a linear, branched, or cyclic alkenyl group having 2 to 30 carbon atoms, a group having 1 to 30 atoms and including a hetero atom (e.g., halogen atom, oxygen atom, nitrogen atom, sulfur atom, phosphorus atom, or silicon atom), and the like.

Examples of the substituted linear or branched alkyl group having 1 to 10 carbon atoms include a benzyl group, a methoxymethyl group, a methylthiomethyl group, an ethoxymethyl group, an ethylthiomethyl group, a phenoxymethyl group, a methoxycarbonylmethyl group, an ethoxycarbonylmethyl group, an acetylmethyl group, a fluoromethyl group, a trifluoromethyl group, a chloromethyl group, a trichloromethyl group, a 2-fluoropropyl group, a (trifluoroacetyl)methyl group, a (trichloroacetyl)methyl group, a (pentafluorobenzoyl)methyl group, an aminomethyl group, a (cyclohexylamino)methyl group, a (trimethylsilyl)methyl group, a 2-phenylethyl group, a 2-aminoethyl group, a 3-phenylpropyl group, and the like.

Examples of the unsubstituted aryl group having 6 to 18 carbon atoms include a phenyl group, a 1-naphthyl group, a 2-naphthyl group, a 1-anthryl group, a 1-phenanthryl group, and the like. Examples of a substituent for the aryl group include a linear, branched, or cyclic alkyl group having 1 to 30 carbon atoms, a group having 1 to 30 atoms and including a hetero atom (e.g., halogen atom, oxygen atom, nitrogen atom, sulfur atom, phosphorus atom, or silicon atom), and the like. Examples of the substituted aryl group having 6 to 18 carbon atoms include an o-tolyl group, a m-tolyl group, a p-tolyl group, a 4-hydroxyphenyl group, a 4-methoxyphenyl group, a mesityl group, an o-cumenyl group, a 2,3-xylyl group, a 2,4-xylyl group, a 2,5-xylyl group, a 2,6-xylyl group, a 3,4-xylyl group, a 3,5-xylyl group, a 4-fluorophenyl group, a 4-trifluoromethylphenyl group, a 4-chlorophenyl group, a 4-bromophenyl group, a 4-iodophenyl group, and the like.

Examples of the ring formed by two or more of $R^{15}$, $R^{16}$, and $R^{17}$, or $R^{18}$ and $R^{19}$, include 5 to 7-membered ring structure and the like.

Specific example of a preferable monomer that produces the repeating unit shown by the formula (4) include compounds shown by the following formulas (4-3) to (4-7). Among these, the compounds shown by the formulas (4-6) and (4-7) are preferable due to excellent sensitivity.

(4-3)

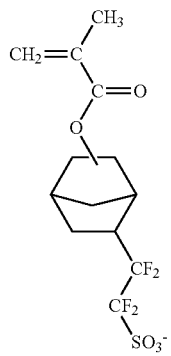
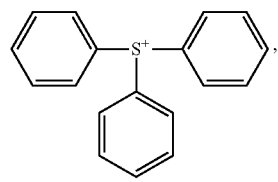

(4-4)

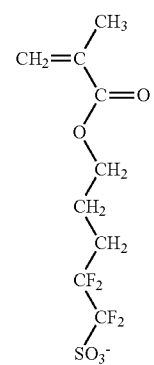
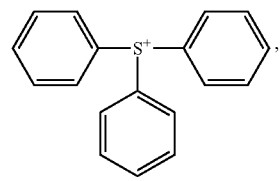

(4-5)

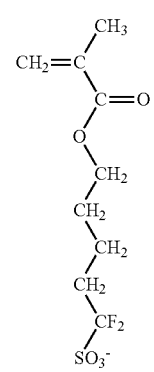
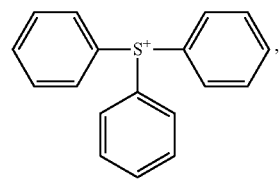

(4-6)

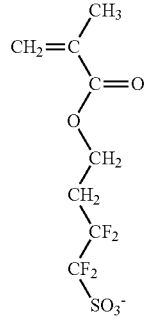
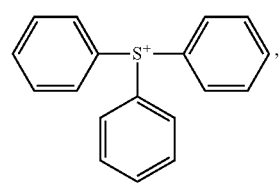

-continued

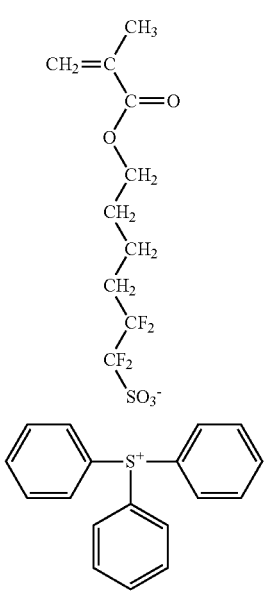

(4-7)

The content of the repeating unit (ii) in the polymer (A) is preferably 1 mol % or more, more preferably 1 to 30 mol %, and particularly preferably 1 to 10 mol %, based on the total amount (=100 mol %) of the repeating units included in the polymer (A). If the content of the repeating unit (ii) is 1 mol % or more, a radiation-sensitive resin composition that includes the polymer (A) as an acid-dissociable group-containing polymer exhibits excellent sensitivity.

Repeating Unit (iii)

The repeating unit (iii) is a repeating unit shown by the formula (5), a repeating unit shown by the formula (6), or a repeating unit that includes a repeating unit shown by the formula (5) and a repeating unit shown by the formula (6).

Examples of the linear or branched alkyl group having 1 to 12 carbon atoms represented by $R^{12}$ in the formulas (5) and (6) include a methyl group, an ethyl group, an n-propyl group, an i-propyl group, an n-butyl group, a 2-methylpropyl group, a 1-methylpropyl group, a t-butyl group, and the like.

Specific examples of the group represented by $R^5$ in the formula (5) include the groups mentioned above as specific examples of the group represented by $R^2$ in the formula (1). Note that s in the formula (5) is an integer from 1 to 5, and preferably 1 or 2.

Examples of the linear, branched, or cyclic divalent hydrocarbon group having 1 to 40 carbon atoms represented by B in the formula (6) include a methylene group, an ethylene group, a propylene group, an isopropylene group, and the like.

Specific examples of a repeating unit shown by the formula (5) include the repeating units shown by the following formulas (5-1) and (5-2). The polymer (A) may include only one type of repeating unit shown by the formula (5), or may include two or more types of repeating unit shown by the formula (5). The repeating units shown by the formulas (5-1) and (5-2) may be obtained by polymerizing the corresponding monomer that includes a polymerizable unsaturated bond.

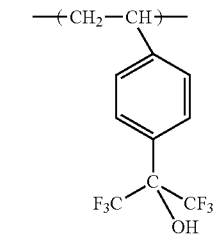

(5-1)

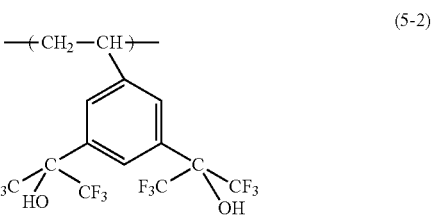

(5-2)

Specific examples of a repeating unit shown by the formula (6) include the repeating unit shown by the following formula (6-1). The polymer (A) may include only one type of repeating unit shown by the formula (6), or may include two or more types of repeating unit shown by the formula (6). The repeating units shown by the formula (6-1) may be obtained by polymerizing the corresponding monomer that includes a polymerizable unsaturated bond.

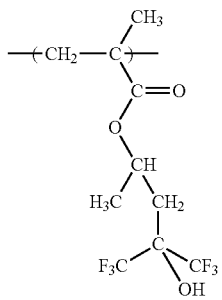

(6-1)

The content of the repeating unit (iii) in the polymer (A) is preferably 20 mol % or more, more preferably 20 to 50 mol %, and particularly preferably 20 to 40 mol %, based on the total amount (=100 mol %) of the repeating units included in the polymer (A). If the content of the repeating unit (iii) is 20 mol % or more, a radiation-sensitive resin composition that includes the polymer (A) as an acid-dissociable group-containing polymer exhibits more excellent sensitivity.

The polymer (A) may include an acid-dissociable group-containing repeating unit shown by the formula (7).

Examples of the acid-dissociable group including an alicyclic skeleton and having 3 to 25 carbon atoms represented by X in the formula (7) include a 2-methyl-2-adamantyl group, 2-ethyl-2-adamantyl group, a 1-ethylcyclopentyl-1-methylcyclopentyl group, a 2-methyl-2-adamantyloxycarbonylmethyl group, a 2-ethyl-2-adamantyloxycarbonylmethyl group, a 1-ethylcyclopenthyloxycarbonylmethyl group, a 1-methylcyclopentyloxycarbonylmethyl group, the group shown by the following formula (8), a group shown by the following formula (9), and the like.

(8)

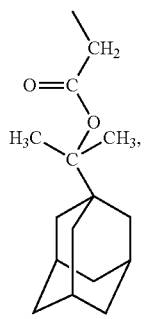

(9)

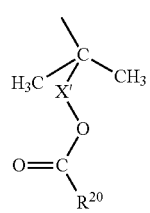

wherein $R^{20}$ represents a linear or branched monovalent alkyl group having 1 to 8 carbon atoms or an alicyclic group having 3 to 25 carbon atoms. X' represents a linear or branched alkyl group having 1 to 12 carbon atoms, a substituted or unsubstituted methylene group, or an alkylene group having 2 to 8 carbon atoms.

Examples of the linear or branched monovalent alkyl group having 1 to 8 carbon atoms represented by $R^{20}$ include a methyl group, an ethyl group, a propyl group, a butyl group, and the like.

The alicyclic site of the alicyclic group having 3 to 25 carbon atoms represented by $R^{20}$ may be monocyclic or polycyclic. The alicyclic site may be bridged. Specific examples of the alicyclic structure include the structures shown by the following formulas (a-1) to (a-50).

 (a-1)

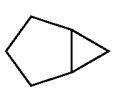 (a-2)

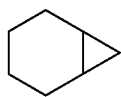 (a-3)

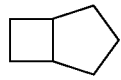 (a-4)

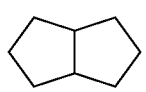 (a-5)

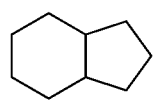 (a-6)

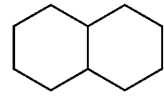 (a-7)

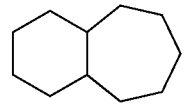 (a-8)

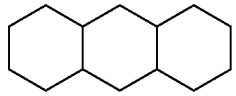 (a-9)

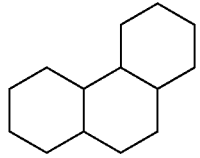 (a-10)

 (a-11)

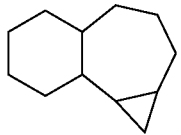 (a-12)

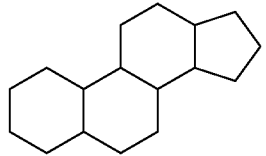 (a-13)

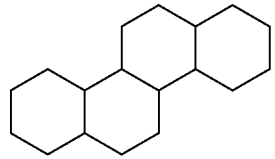 (a-14)

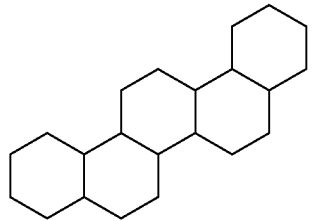 (a-15)

 (a-16)

 (a-17)

(a-18) 
(a-19) 
(a-20) 
(a-21) 
(a-22) 
(a-23) 
(a-24) 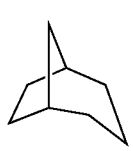
(a-25) 
(a-26) 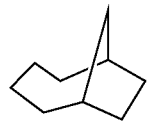
(a-27) 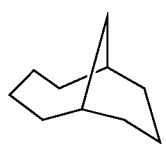
(a-28) 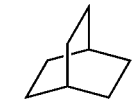
(a-29) 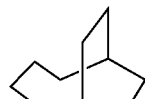
(a-30) 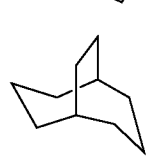
(a-31) 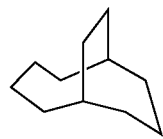
(a-32) 
(a-33) 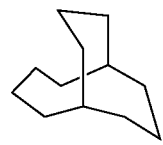
(a-34) 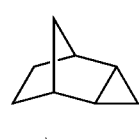
(a-35) 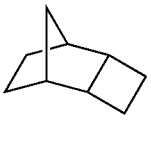
(a-36) 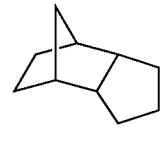
(a-37) 
(a-38) 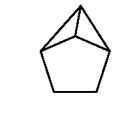
(a-39) 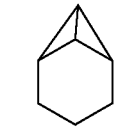
(a-40) 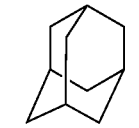
(a-41) 
(a-42) 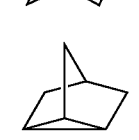

(a-43) 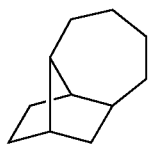

(a-44) 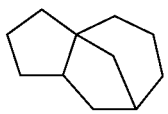

(a-45) 

(a-46) 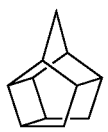

(a-47) 

(a-48) 

(a-49) 

(a-50) 

The number of carbon atoms of the alicyclic group is 5 to 25, preferably 6 to 20, and more preferably 7 to 15.

Specific examples of the alicyclic group include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group. Among these, an adamantyl group, a decalin residue, a norbornyl group, a cedrol group, a cyclohexyl group, a cycloheptyl group, a cyclooctyl group, a cyclodecanyl group, and a cyclododecanyl group are preferable. The alicyclic group is particularly preferably a cycloalkyl group having 7 to 15 carbon atoms.

Note that the alicyclic group may be substituted. Specific examples of a substituent for the alicyclic group include a hydroxyl group, a carboxyl group, a halogen atom (e.g., fluorine atom and bromine atom), an alkoxy group (e.g., methoxy group, ethoxy group, propoxy group, and butoxy group), an alkyloxycarbonyl group, and the like.

The repeating unit shown by the formula (7) that includes a group shown by the formula (9) may be obtained using a monomer shown by the following formula (7-1), for example.

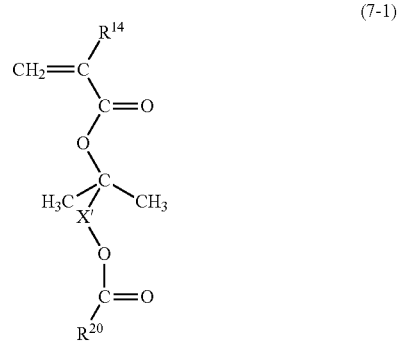

(7-1)

wherein $R^{14}$, $R^{20}$, and X' are the same as defined for the formulas (7) and (9).

The monomer shown by the formula (7-1) may be produced by reacting 3-methyl-1,3-butanediol with 1-adamantane carbonyl chloride to synthesize a tertiary alcohol compound that includes an adamantane residue, and reacting the tertiary alcohol compound with methacrylic chloride, for example.

The content of the acid-dissociable group-containing repeating unit shown by the formula (7) in the polymer (A) is preferably 15 to 40 mol %, and more preferably 20 to 35 mol %, based on the total amount (=100 mol %) of the repeating units included in the polymer (A). If the content of the acid-dissociable group-containing repeating unit is less than 15 mol %, the resolution may decrease. If the content of the acid-dissociable group-containing repeating unit exceeds 40 mol %, the resulting resist pattern may exhibit insufficient adhesion to the substrate.

The polymer (A) may further include a repeating unit derived from a non-acid-dissociable group-containing monomer (hereinafter may be referred to as "non-acid-dissociable group-containing repeating unit") in addition to the above repeating units.

Examples of the monomer that produces the non-acid-dissociable group-containing repeating unit include styrene, α-methylstyrene, 4-methylstyrene, 2-methylstyrene, 3-methylstyrene, isobornyl acrylate, tricyclodecanyl(meth)acrylate, tetracyclododecenyl(meth)acrylate, the monomer shown by the following formula (10), and the like. Among these, styrene, α-methylstyrene, 4-methylstyrene, 2-methylstyrene, 3-methylstyrene, tricyclodecanyl acrylate, and the monomer shown by the formula (10) are preferable.

When the polymer (A) includes the non-acid-dissociable group-containing repeating unit, the polymer (A) may include only one type of repeating unit derived from the monomer shown by the formula (10), or may include two or more types of repeating unit derived from the monomer shown by the formula (10).

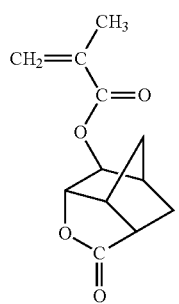

(10)

The content of the non-acid-dissociable group-containing repeating unit in the polymer (A) is preferably 0 to 60 mol %, and more preferably 0 to 40 mol %, based on the total amount (=100 mol %) of the repeating units included in the polymer (A). If the content of the non-acid-dissociable group-containing repeating unit exceeds 60 mol %, the resolution may decrease.

The polymer (A) may be synthesized by an arbitrary method. For example, the polymer (A) may be synthesized by radical polymerization or anionic polymerization. The hydroxystyrene unit (side chain) of the repeating units shown by the formulas (1) to (3) may be obtained by hydrolyzing the resulting resin (e.g., acetoxy group) in an organic solvent in the presence of a base or an acid.

For example, radical polymerization may be implemented by stirring and heating the desired monomers in an appropriate organic solvent under a nitrogen atmosphere in the presence of a radical initiator.

Examples of the radical initiator include azo compounds such as 2,2'-azobisisobutylonitrile, 2,2'-azobis(2,4-dimethylvaleronitrile), 2,2'-azobis(4-methoxy-2,4-dimethylvaleronitrile), 2,2'-azobismethylbutyronitrile, 2,2'-azobiscyclohexanecarbonitrile, cyanomethylethylazoformamide, 2,2'-azobis(methyl 2,4-dimethylpropanate), and 2,2'-azobiscyanovaleric acid; organic peroxides such as benzoyl peroxide, lauroyl peroxide, 1,1'-bis(t-butylperoxy)cyclohexane, 3,5,5-trimethylhexanoyl peroxide, and t-butyl peroxy-2-ethylhexanoate; hydrogen peroxide; and the like.

A polymerization promoter such as 2,2,6,6-tetramethyl-1-piperidinyloxy, iodine, a mercaptan, or a styrene dimmer may optionally be used for radical polymerization.

The radical polymerization temperature is appropriately selected (e.g., 50 to 200° C.) depending on the type of initiator and the like. When using an azo initiator or a peroxide initiator, the radical polymerization temperature is preferably determined so that the half-life of the initiator is about 10 minutes to about 30 hours (more preferably about 30 minutes to about 10 hours).

The reaction time is determined depending on the type of initiator and the reaction temperature, but is preferably determined so that 50% or more of the initiator is consumed (generally about 0.5 to about 24 hours).

Anionic polymerization may be implemented by stirring the monomers at a given temperature in an appropriate organic solvent under a nitrogen atmosphere in the presence of an anionic initiator, for example.

Examples of the anionic initiator include organic alkali metals such as n-butyllithium, s-butyllithium, t-butyllithium, ethyllithium, ethylsodium, 1,1-diphenylhexyllithium, 1,1-diphenyl-3-methylpentyllithium, and the like.

The anionic polymerization temperature is appropriately selected depending on the type of initiator and the like. When using an alkyllithium as the initiator, the anionic polymerization temperature is preferably −100 to 50° C., and more preferably −78 to 30° C.

The reaction time is determined depending on the type of initiator and the reaction temperature, but is preferably determined so that 50% or more of the initiator is consumed (generally about 0.5 to about 24 hours).

Note that the polymer (A) may be synthesized by heating the monomers without using an initiator, or may be synthesized by cationic polymerization.

Examples of the acid used when introducing the hydroxystyrene unit by hydrolyzing the side chain of the polymer (A) include organic acids such as p-toluenesulfonic acid, a hydrate thereof, methanesulfonic acid, trifluoromethanesulfonic acid, malonic acid, oxalic acid, and 1,1,1-fluoroacetic acid; inorganic acids such as sulfuric acid, hydrochloric acid, phosphoric acid, and hydrobromic acid; salts such as pyridinium p-toluenesulfonate, ammonium p-toluenesulfonate, and 4-methylpyridinium p-toluenesulfonate; and the like.

Examples of the base include inorganic bases such as potassium hydroxide, sodium hydroxide, sodium carbonate, and potassium carbonate; organic bases such as triethylamine, N-methyl-2-pyrrolidone, piperidine, and tetramethylammonium hydroxide; and the like.

Examples of the organic solvent used for polymerization or hydrolysis include ketones such as acetone, methyl ethyl ketone, and methyl amyl ketone; ethers such as diethyl ether and tetrahydrofuran (THF); alcohols such as methanol, ethanol, and propanol; aliphatic hydrocarbons such as hexane, heptane, and octane; aromatic hydrocarbons such as benzene, toluene, and xylene; alkyl halides such as chloroform, bromoform, methylene chloride, methylene bromide, and carbon tetrachloride; esters such as ethyl acetate, butyl acetate, ethyl lactate, propylene glycol monomethyl ether, propylene glycol monomethyl ether acetate, and cellosolve; aprotic polar solvents such as dimethylformamide, dimethyl sulfoxide, and hexamethylphosphoroamide; and the like.

Among these, acetone, methyl amyl ketone, methyl ethyl ketone, tetrahydrofuran, methanol, ethanol, propanol, ethyl acetate, butyl acetate, ethyl lactate, propylene glycol monomethyl ether, propylene glycol monomethyl ether acetate, and the like are preferable.

The polystyrene-reduced weight average molecular weight (hereinafter may be referred to as "Mw") of the polymer (A) determined by gel permeation chromatography (GPC) is preferably 3000 to 100,000, more preferably 3000 to 60,000, and still more preferably 4000 to 40,000.

The ratio (Mw/Mn) of the Mw to the polystyrene-reduced number average molecular weight (hereinafter may be referred to as "Mn") of the polymer (A) determined by GPC is normally 1 to 5. The ratio (Mw/Mn) is preferably 1 to 3, and more preferably 1 to 2.5.

The radiation-sensitive resin composition according to one embodiment of the invention may include a photoacid generator (hereinafter may be referred to as "acid generator (B)").

The acid generator (B) generates an acid when applying electron beams, radiation, or the like to the radiation-sensitive resin composition during a lithographic process. The acid-dissociable group included in the polymer dissociates due to the acid generated by the acid generator (B).

The acid generator (B) is preferably at least one compound selected from the group consisting of onium salts, diazomethane compounds, and sulfonimide compounds in order to achieve an excellent acid generation efficiency, heat resistance, and the like. These acid generators may be used either individually or in combination.

Examples of the onium salts include iodonium salts, sulfonium salts, phosphonium salts, diazonium salts, pyridinium salts, and the like.

Specific examples of the onium salts include triphenylsulfonium trifluoromethanesulfonate, triphenylsulfonium nonafluoro-n-butanesulfonate, triphenylsulfonium benzenesulfonate, triphenylsulfonium 10-camphorsulfonate, sulfonium salts shown by the following formulas (11-1), (11-2), and (11-3), diphenyliodonium trifluoromethanesulfonate, diphenyliodonium nonafluoro-n-butanesulfonate, and the like.

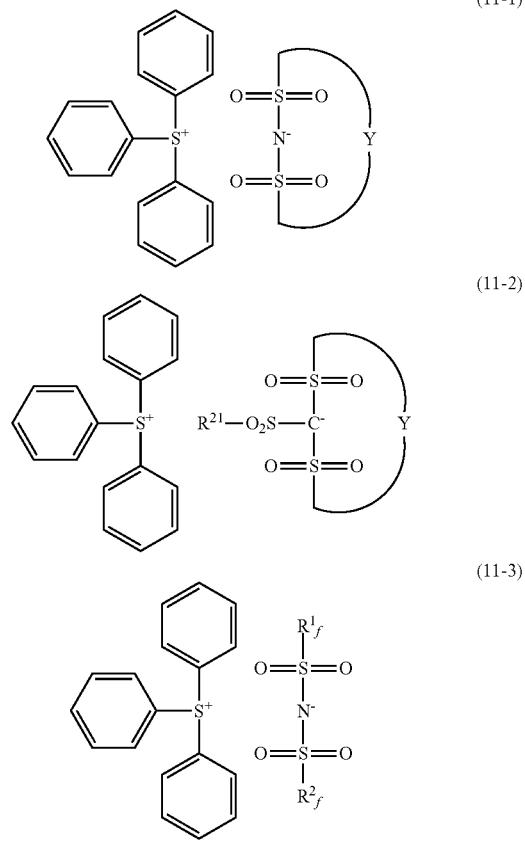

wherein Y represents an alkylene group having 2 to 6 carbon atoms that is substituted with at least one fluorine atom, and $R^{21}$ represents a linear, branched, or cyclic alkyl group having 1 to 40 carbon atoms that may be substituted with a substituent that includes a hetero atom.

At least one of $R_f^1$ and $R_f^2$ represents a linear, branched, or cyclic alkyl group having 1 to 20 carbon atoms that includes at least one fluorine atom, and may include a hydroxyl group, a carbonyl group, an ester group, an ether group, or an aryl group. When only one of $R_f^1$ and $R_f^2$ represents a linear, branched, or cyclic alkyl group having 1 to 20 carbon atoms that includes at least one fluorine atom, the other of $R_f^1$ and $R_f^2$ represents a linear, branched, or cyclic alkyl group having 1 to 20 carbon atoms that may include a hydroxyl group, a carbonyl group, an ester group, an ether group, or an aryl group.

Examples of the linear, branched, or cyclic alkyl group having 1 to 20 carbon atoms that includes at least one fluorine atom include a methyl group, an ethyl group, a propyl group, a butyl group, and the like. Examples of the linear, branched, or cyclic alkyl group having 1 to 20 carbon atoms include a methyl group, an ethyl group, a propyl group, a butyl group, and the like.

Examples of the diazomethane compounds include bis(cyclohexylsulfonyl)diazomethane, bis(3,3-dimethyl-1,5-dioxaspiro[5.5]dodecane-8-sulfonyl)diazomethane, and bis(1,4-dioxaspiro[4.5]decane-7-sulfonyl)diazomethane.

Examples of the sulfonimide compounds include N-(trifluoromethylsulfonyloxy)bicyclo[2.2.1]hept-5-ene-2,3-dicarboxyimide, N-(10-camphorsulfonyloxy)succinimide, and N-[(5-methyl-5-carboxymethylbicyclo[2.2.1]heptan-2-yl)sulfonyloxy]succinimide.

When the radiation-sensitive resin composition according to one embodiment of the invention includes the acid generator (B), the acid generator (B) is preferably used in an amount of 0.1 to 50 parts by mass, and more preferably 0.5 to 50 parts by mass, based on 100 parts by mass of the polymer (A). If the amount of the acid generator (B) is less than 0.1 parts by mass, the sensitivity and the developability of the radiation-sensitive resin composition may decrease. If the amount of the acid generator (B) exceeds 50 parts by mass, the transparency to radiation, the pattern shape, the heat resistance, and the like of the radiation-sensitive resin composition may deteriorate.

The radiation-sensitive resin composition according to one embodiment of the invention preferably further includes an acid diffusion controller (hereinafter may be referred to as "acid diffusion controller (C)") in addition to the polymer (A) and the optional acid generator (B).

The acid diffusion controller (C) controls a phenomenon wherein an acid generated upon exposure is diffused in the resist film, and suppresses undesired chemical reactions in the unexposed area. The acid diffusion controller (C) improves the storage stability of the resulting radiation-sensitive resin composition and the resolution of a resist film that is formed using the radiation-sensitive resin composition. Moreover, the acid diffusion controller (C) prevents a change in line width of the resist pattern due to a change in post-exposure delay (PED) from exposure to post-exposure bake, so that a radiation-sensitive resin composition that exhibits excellent process stability can be obtained.

A nitrogen-containing organic compound or a photosensitive basic compound is preferably used as the acid diffusion controller (C).

Examples of the nitrogen-containing organic compound include a compound shown by the following formula (12) (hereinafter may be referred to as "nitrogen-containing compound (i)"), a compound that includes two nitrogen atoms in the molecule (hereinafter may be referred to as "nitrogen-containing compound (ii)"), a polyamino compound or a polymer that includes three or more nitrogen atoms (hereinafter may be collectively referred to as "nitrogen-containing compound (iii)"), an amide group-containing compound, a urea compound, a nitrogen-containing heterocyclic compound, and the like.

(12)

wherein $R^{22}$ individually represent a hydrogen atom, a substituted or unsubstituted linear, branched or cyclic alkyl group, a substituted or unsubstituted aryl group, or a substituted or unsubstituted aralkyl group.

Examples of a preferable nitrogen-containing compound (i) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; and substituted alkylamines such as triethanolamine; aromatic amines such as aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-t-butyl-N-methylaniline, N-phenyldiethanolamine, and 2,6-diisopropylaniline; and the like.

Examples of a preferable nitrogen-containing compound (ii) include ethylenediamine, N,N,N',N'-tetramethylethylenediamine, tetramethylenediamine, hexamethylenediamine, 4,4'-diaminodiphenylmethane, 4,4'-diamino diphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolizinone, 2-quinoxalinol, N,N,N',N'-tetrakis(2-hydroxypropyl)ethylenediamine, N,N,N',N'',N''-pentamethyldiethylenetriamine, and the like.

Examples of a preferable nitrogen-containing compound (iii) include polyethyleneimine, polyallylamine, poly(2-dimethylaminoethylacrylamide), and the like.

Examples of a preferable amide group-containing compound include N-t-butoxycarbonyl group-containing amino compounds such as N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanuric acid, and the like.

Examples of a preferable urea compound include urea, methylurea, 1,1-dimethylurea, 1,3-dimethylurea, 1,1,3,3-tetramethylurea, 1,3-diphenylurea, tri-n-butylthiourea, and the like.

Examples of a preferable nitrogen-containing heterocyclic compound include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine, and 2,2':6',2''-terpyridine; piperazines such as piperazine and 1-(2-hydroxyethyl)piperazine; pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

The photosensitive basic compound is decomposed and loses basicity in the exposed area, but remains undecomposed in the unexposed area. The photosensitive basic compound can effectively utilize an acid generated in the exposed area, and can thus improve the sensitivity as compared with a basic compound that does not exhibit photosensitivity.

The photosensitive basic compound is not particularly limited as long as the photosensitive basic compound has the above properties. Specific examples of the photosensitive basic compound include compounds shown by the following formulas (13-1) and (13-2).

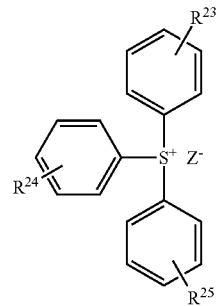

(13-1)

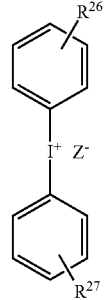

(13-2)

wherein, $R^{23}$ to $R^{27}$ individually represent a hydrogen atom, a halogen atom, a substituted or unsubstituted alkyl group having 1 to 10 carbon atoms, or a substituted or unsubstituted alicyclic hydrocarbon group, and $Z^-$ represents $OH^-$, $R^{28}O^-$, or $R^{28}COO^-$, and $R^{28}$ represents a monovalent organic group.

Examples of the substituted or unsubstituted alkyl group having 1 to 10 carbon atoms represented by $R^{23}$ to $R^{27}$ in the formulas (13-1) and (13-2) include a methyl group, an ethyl group, an n-butyl group, a t-butyl group, a trifluoromethyl group, and the like. Note that the alkyl group may be substituted with a hydroxyl group, a carboxyl group, a halogen atom (e.g., fluorine atom or bromine atom), an alkoxy group (e.g., methoxy group, ethoxy group, propoxy group, butoxy group, or t-butoxy group), an alkyloxycarbonyl group (e.g., t-butoxycarbonylmethyloxy group), or the like.

Examples of the substituted or unsubstituted alicyclic hydrocarbon group represented by $R^{23}$ to $R^{27}$ include the structures shown by the formulas (a-1) to (a-50), and the like. Note that the alicyclic hydrocarbon group may be substituted with a hydroxyl group, a carboxyl group, a halogen atom (e.g., fluorine atom or bromine atom), an alkoxy group (e.g., methoxy group, ethoxy group, propoxy group, butoxy group, or t-butoxy group), an alkyloxycarbonyl group (e.g., t-butoxycarbonylmethyloxy group), or the like.

Examples of the halogen atom represented by $R^{23}$ to $R^{27}$ include a fluorine atom, a chlorine atom, a bromine atom, an iodine atom, and the like.

It is preferable that $R^{23}$ to $R^{27}$ represent a hydrogen atom or a t-butyl group. Note that $R^{23}$ to $R^{25}$ in the formula (13-1) may be either the same or different. $R^{26}$ and $R^{27}$ in the formula (13-2) may be either the same or different.

$Z^-$ in the formulas (13-1) and (13-2) represents $OH^-$, $R^{28}O^-$, or $R^{28}COO^-$.

Examples of the monovalent organic group represented by $R^{28}$ include a substituted or unsubstituted alkyl group, a substituted or unsubstituted aryl group, and the like.

$Z^-$ preferably represents $OFF$, $CH_3COO^-$, or any of the compounds (Z-1) to (Z-3) shown by the following formulas.

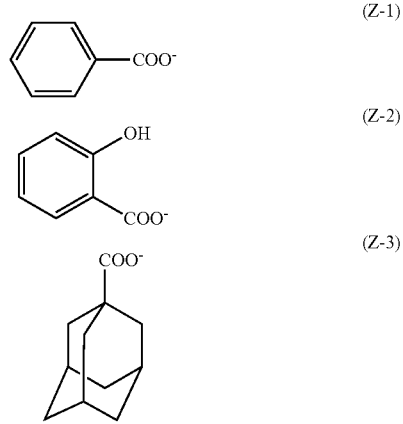

Specific examples of the photosensitive basic compound include a triphenylsulfonium compound shown by the formula (13-1) wherein the anion moiety ($Z^-$) is $OH^-$, $CH_3COO^-$, or the compound (Z-2) or (Z-3), and the like.

These acid diffusion controllers (C) may be used either individually or in combination.

The acid diffusion controller (C) is preferably used in an amount of 15 parts by mass or less, more preferably 0.001 to 10 parts by mass, and still more preferably 0.005 to 5 parts by mass, based on 100 parts by mass of the polymer (A). If the amount of the acid diffusion controller (C) exceeds 15 parts by mass, the sensitivity of the resulting resist film or the developability of the exposed area may decrease. If the amount of the acid diffusion controller (C) is less than 0.001 parts by mass, the pattern shape or the dimensional accuracy of the resulting resist film may deteriorate depending on the process conditions.

The radiation-sensitive resin composition according to one embodiment of the invention is preferably prepared by dissolving the polymer (A) and the acid diffusion controller (C) in a solvent (D). Specifically, the radiation-sensitive resin composition preferably further includes the solvent (D).

The radiation-sensitive resin composition according to one embodiment of the invention may optionally include an additive such as a surfactant, a sensitizer, or an aliphatic additive as an additional component.

Examples of the solvent (D) include ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactates such as methyl lactate, ethyl lactate, n-propyl lactate, and i-propyl lactate; aliphatic carboxylic esters such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxybutyl acetate, 3-methyl-3-methoxybutyl acetate, 3-methyl-3-methoxybutyl propionate, 3-methyl-3-methoxybutyl butyrate, methyl acetoacetoate, ethyl acetoacetate, methyl pyruvate, and ethyl pyruvate; aromatic hydrocarbons such as toluene and xylene; ketones such as methyl ethyl ketone, 2-pentanone, 2-hexanone, 2-heptanone, 3-heptanone, 4-heptanone, and cyclohexanone; amides such as N-methylformamide, N,N-dimethylformamide, N-methylacetamide, N,N-dimethylacetamide, and N-methylpyrrolidone; lactones such as γ-butyrolactone; and the like.

These solvents (D) may be used either individually or in combination.

The radiation-sensitive resin composition according to one embodiment of the invention preferably has a total solid content of 1 to 50 mass %, and more preferably 1 to 25 mass %.

The radiation-sensitive resin composition according to one embodiment of the invention may be prepared by homogeneously dissolving the polymer (A), the acid generator (B), the acid diffusion controller (C), and the additional component (excluding a solvent) in the solvent so that the total solid content is within the above range. The radiation-sensitive resin composition thus prepared is preferably filtered through a filter having a pore size of about 0.2 µm, for example.

The surfactant improves the applicability, striation, developability, and the like of the radiation-sensitive resin composition.

Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate, commercially available products such as KP341

(manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like. These surfactants may be used either individually or in combination.

The surfactant is preferably used in an amount of 0.001 to 2 parts by mass based on 100 parts by mass of the polymer (A).

The sensitizer absorbs the energy of radiation, and transmits the energy to the acid generator (B) so that the amount of acid generated by the acid generator (B) increases. Specifically, the sensitizer improves the apparent sensitivity of the radiation-sensitive resin composition.

Examples of the sensitizer include carbazoles, acetophenones, benzophenones, naphthalenes, phenols, biacetyl, eosine, rose bengal, pyrenes, anthracenes, phenothiazines, and the like. These sensitizers may be used either individually or in combination.

The sensitizer is preferably used in an amount of 0.1 to 10 parts by mass based on 100 parts by mass of the polymer (A).

A dye or a pigment visualizes the latent image in the exposed area to reduce the effects of halation during exposure. An adhesion improver improves the adhesion of the resist film to the substrate.

The alicyclic additive improves the dry etching resistance, the pattern shape, adhesion to the substrate, and the like.

Examples of the alicyclic additive include adamantane derivatives such as 1-adamantanecarboxylic acid, 2-adamantanone, t-butyl-1-adamantanecarboxylate, t-butoxycarbonylmethyl 1-adamantanecarboxylate, a-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; 3-[2-hydroxy-2,2-bis(trifluoromethyl)ethyl]tetracyclo[$4.4.0.1^{2,5}.1^{7,10}$]dodecane; and the like. These alicyclic additives may be used either individually or in combination.

The alicyclic additive is preferably used in an amount of 0.5 to 20 parts by mass based on 100 parts by mass of the polymer (A). If the amount of the alicyclic additive exceeds 20 parts by mass, the heat resistance of the resulting resist film may decrease.

Examples of further additives include an alkali-soluble resin, a low-molecular-weight alkali solubility controller that includes an acid-dissociable protecting group, a halation inhibitor, a preservation stabilizer, an anti-foaming agent, and the like.

The radiation-sensitive resin composition according to one embodiment of the invention is useful as a material for forming a chemically-amplified positive-tone resist film.

The chemically-amplified positive-tone resist film is designed so that the acid-dissociable group included in the polymer dissociates due to an acid generated by the acid generator upon exposure so that the polymer becomes alkali-soluble. Specifically, an alkali-soluble area is formed in the resist film. The alkali-soluble area corresponds to the exposed area of the resist. The exposed area can be dissolved and removed using an alkaline developer. A positive-tone resist pattern having a desired shape can thus be formed. The resist pattern-forming process is described in detail below.

First, a resist film is formed using the radiation-sensitive resin composition according to one embodiment of the invention. The radiation-sensitive resin composition may have been filtered through a filter having a pore size of about 0.2 µm after adjusting the total solid content, for example. The radiation-sensitive resin composition is applied to a substrate (e.g., silicon wafer or aluminum-coated wafer) using an appropriate application method (e.g., rotational coating, cast coating, or roll coating) to form a resist film. The resist film may optionally be pre-baked (PB) at about 70 to 160° C. The resist film is then exposed to form a desired resist pattern. Examples of radiation that may be used for exposure include (extreme) deep ultraviolet rays such as KrF excimer laser light (wavelength: 248 nm), EUV (extreme ultraviolet rays, wavelength: 13.5 nm), X-rays such as synchrotron radiation, charged particle rays such as electron beams, and the like. The exposure conditions (e.g., dose) may be appropriately selected depending on the composition of the radiation-sensitive resin composition, the type of additive, and the like. Note that liquid immersion lithography may also be used.

The resist film is preferably subjected to post-exposure bake (PEB) after exposure. PEB ensures smooth dissociation of the acid-dissociable group included in the polymer. The PEB conditions may be appropriately selected depending on the composition of the radiation-sensitive resin composition. The PEB temperature is preferably 30 to 200° C., and more preferably 50 to 170° C.

In order to bring out the potential of the radiation-sensitive resin composition to a maximum extent, an organic or inorganic anti-reflective film may be formed on the substrate, as disclosed in Japanese Examined Patent Publication (KOKOKU) No. 6-12452 (Japanese Patent Application Publication (KOKAI) No. 59-93448), for example. A protective film may be formed on the resist film so that the resist film is not affected by basic impurities and the like contained in the environmental atmosphere, as disclosed in Japanese Patent Application Publication (KOKAI) No. 5-188598, for example. These methods may be used in combination.

The resist film thus exposed is developed to form a given resist pattern. As the developer, it is preferable to use an alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water.

The concentration of the alkaline aqueous solution is preferably 10 mass % or less. If the concentration of the aqueous alkaline solution exceeds 10 mass %, the unexposed area may also be dissolved in the developer. The pH of the developer is preferably 8 to 14, and more preferably 9 to 14.

An organic solvent may be added to the alkaline aqueous solution (developer), for example. Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methanol, ethanol, n-propyl alcohol, i-propyl alcohol, n-butyl alcohol, t-butyl alcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like. These organic solvents may be used either individually or in combination.

The organic solvent is preferably used in an amount of 100 parts by volume or less based on 100 parts by volume of the alkaline aqueous solution. If the amount of the organic solvent exceeds 100 parts by volume, the exposed area may remain undeveloped due to a decrease in developability. An appropriate amount of a surfactant or the like may also be added to the alkaline aqueous solution (developer).

After development using the aqueous alkaline solution (developer), the resist film may be washed with water, and dried.

EXAMPLES

The invention is further described below by way of examples. Note that the invention is not limited to the following examples. In the following examples, electron beams (EB) were used to expose the resist film. Note that similar basic resist properties are obtained using short-wavelength radiation (e.g., EUV), and a correlation is observed between the basic resist properties obtained using electron beams (EB) and the basic resist properties obtained using short-wavelength radiation (e.g., EUV). In the examples and comparative examples, the unit "parts" refers to "parts by mass", and the unit "%" refers to "mass %" unless otherwise specified. The Mw and the Mn of the polymer were measured by the following method.

Mw and Mn

The Mw and the Mn of the polymer were measured by gel permeation column chromatography (GPC) using GPC columns manufactured by Tosoh Corp. (TSK GEL SUPER AW 3000×1, TSK GEL SUPER AW 2500×3) (standard: monodisperse polystyrene, flow rate: 1.0 ml/min, eluant dimethylformamide (containing 20 mM anhydrous LiBr and 20 mM $H_3PO_4$), column temperature: 40° C.). The dispersity (Mw/Mn) was calculated from the Mw and Mn measurement results.

Polymer Example 1

39.8 g of 4-acetoxystyrene, 66.2 g of 4-bis(hexafluoro-α-hydroxyisopropyl)styrene, 53.0 g of 2-ethyladamantyl acrylate, 21.0 g of the monomer shown by the formula (4-6), 4.96 g of 2,2'-azobisisobutyronitrile (AIBN), and 1.64 g of t-dodecylmercaptan were dissolved in 40 g of propylene glycol monomethyl ether. The monomers were polymerized in a nitrogen atmosphere with stirring (at 70° C. for 3 hours, at 75° C. for 3 hours, and at 95° C. for 1 hour). After completion of polymerization, the reaction solution was added dropwise to 1000 g of hexane to coagulate and purify the polymer. After the addition of 180 g of propylene glycol monomethyl ether to 140 g of the dried polymer, 300 g of methanol, 21.2 g of triethylamine, and 3.8 g of water were added to the mixture. The mixture was hydrolyzed for 8 hours under reflux at the boiling point. After completion of hydrolysis, the solvent and triethylamine were evaporated under reduced pressure to obtain a copolymer. After dissolving the copolymer in 200 g of acetone, the solution was added dropwise to 2000 g of water to coagulate the copolymer. A white powder thus produced was dried overnight at 50° C. under reduced pressure to obtain a polymer (A-1).

The polymer (A-1) had an Mw of 13,000 and a dispersity (Mw/Mn) of 2.0. The copolymerization ratio (molar ratio) of the polymer (A-1) determined by $^{13}$C-NMR analysis was (a):(b):(c):(d)=32.5:32.5:30:5 (see the following formula (14)). Note that the repeating units (a) to (d) are not necessarily arranged in the order shown by the formula (14).

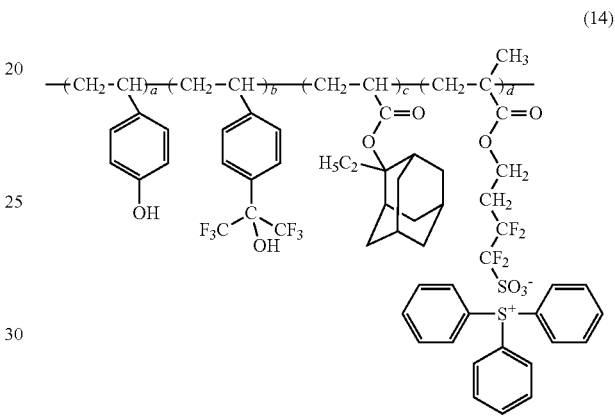

(14)

Polymer Comparative Example 1

46.1 g of 4-acetoxystyrene, 76.8 g of 4-bis(hexafluoro-α-hydroxyisopropyl)styrene, 57.1 g of 2-ethyladamantyl acrylate, 5.3 g of AIBN, and 1.87 g of t-dodecylmercaptan were dissolved in 40 g of propylene glycol monomethyl ether. The monomers were polymerized in a nitrogen atmosphere with stirring (at 70° C. for 3 hours, at 75° C. for 3 hours, and at 95° C. for 1 hour). After completion of polymerization, the reaction solution was added dropwise to 1000 g of hexane to coagulate and purify the polymer. After the addition of 180 g of propylene glycol monomethyl ether to 140 g of the dried polymer, 300 g of methanol, 25.0 g of triethylamine, and 4.4 g of water were added to the mixture. The mixture was hydrolyzed for 8 hours under reflux at the boiling point. After completion of hydrolysis, the solvent and triethylamine were evaporated under reduced pressure to obtain a copolymer. After dissolving the copolymer in 200 g of acetone, the solution was added dropwise to 2000 g of water to coagulate the copolymer. A white powder thus produced was dried overnight at 50° C. under reduced pressure to obtain a polymer (A-2).

The polymer (A-2) had an Mw of 13,000 and a dispersity (Mw/Mn) of 2.0. The copolymerization ratio (molar ratio) of the polymer (A-2) determined by $^{13}$C-NMR analysis was (a):(b):(c)=35:35:30 (see the following formula (15)). Note that the repeating units (a) to (c) are not necessarily arranged in the order shown by the formula (15).

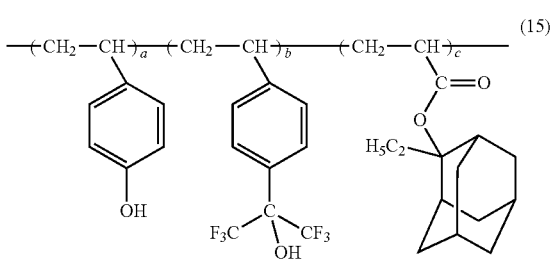

(15)

Polymer Comparative Example 2

111.2 g of 4-acetoxystyrene, 68.8 g of 2-ethyladamantyl acrylate, 6.43 g of AIBN, and 2.12 g of t-dodecylmercaptan were dissolved in 180 g of propylene glycol monomethyl ether. The monomers were polymerized in a nitrogen atmosphere with stirring (at 70° C. for 3 hours, at 75° C. for 3 hours, and at 95° C. for 1 hour). After completion of polymerization, the reaction solution was added dropwise to 1000 g of hexane to coagulate and purify the polymer. After the addition of 180 g of propylene glycol monomethyl ether to 140 g of the dried polymer, 300 g of methanol, 60 g of triethylamine, and 10.6 g of water were added to the mixture. The mixture was hydrolyzed for 8 hours under reflux at the boiling point. After completion of hydrolysis, the solvent and triethylamine were evaporated under reduced pressure to obtain a copolymer. After dissolving the copolymer in 200 g of acetone, the solution was added dropwise to 2000 g of water to coagulate the copolymer. A white powder thus produced was dried overnight at 50° C. under reduced pressure to obtain a polymer (A-3).

The polymer (A-3) had an Mw of 10,000 and a dispersity (Mw/Mn) of 2.3. The copolymerization ratio (molar ratio) of the polymer (A-3) determined by $^{13}$C-NMR analysis was (a):(b)=70:30 (see the following formula (16)). Note that the repeating units (a) and (b) are not necessarily arranged in the order shown by the formula (16).

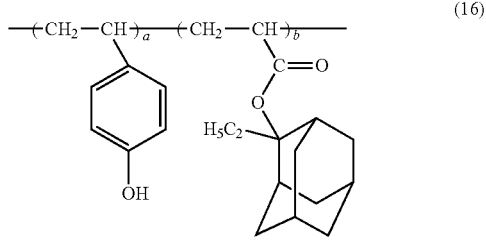

(16)

Composition Example 1 and Composition Comparative Examples 1 and 2

A radiation-sensitive resin composition was prepared using the polymer (A-1) obtained in Polymer Example 1, the polymer (A-2) obtained in Polymer Comparative Example 1, or the polymer (A-3) obtained in Polymer Comparative Example 2 by mixing the components shown in Table 1.

The details of the components other then the polymer (A) are given below.
Acid Generator (B)
(B-1): triphenylsulfonium trifluoromethanesulfonate
Acid Diffusion Controller (C)
(C-1): tri-n-octylamine
Solvent (D)
(D-1): ethyl lactate
(D-2): propylene glycol monomethyl ether acetate The radiation-sensitive resin composition obtained in Composition Example 1 or Composition Comparative Example 1 or 2 was spin-coated onto a silicon wafer using a system "Clean Track ACT-8" (manufactured by Tokyo Electron, Ltd.), and pre-baked (PB) at 130° C. for 60 seconds to form a resist film having a thickness of 60 nm. The resist film was exposed to electron beams using an electron beam drawing system ("HL800D" manufactured by Hitachi, Ltd., output: 50 KeV, current density: 5.0 A/cm$^2$). After exposure, the resist film was subjected to post-exposure bake (PEB) at 130° C. for 60 seconds. The resist film was then developed at 23° C. for 1 minute by a puddle method using a 2.38% tetramethylammonium hydroxide aqueous solution, washed with purified water, and dried to obtain a resist pattern. The resist thus obtained was evaluated by the following methods. The evaluation results are shown in Table 1.

(1) Sensitivity (L/S)

A dose at which a line-and-space pattern (1L1S) including a line area (width: 150 nm) and a space area (groove) (width: 150 nm) defined by the adjacent line areas was formed at a line width of 1:1 was defined as an optimum dose, and the sensitivity was evaluated based on the optimum dose.

(2) Nano Edge Roughness

The line pattern of a line-and-space pattern (1L1S) (design line width: 150 nm) was observed using a scanning electron microscope ("S-9220" manufactured by Hitachi, Ltd.). FIG. 1 shows the shape of the line-and-space pattern thus observed.

In FIG. 1, (a) is a plan view schematically showing the shape of the line-and-space pattern, and (b) is a cross-sectional view schematically showing the shape of the line-and-space pattern. Note that elevations and depressions shown in FIG. 1 is exaggerated for the purpose of explanation.

The nano edge roughness was evaluated by determining a difference "ACD" between the design line width (150 nm) and the line width in an area where elevations and depressions significantly occurred along a side 2a of a line area 2 of a resist film formed on a silicon wafer 1 (see FIG. 1) using a CD-SEM ("S-9220" manufactured by Hitachi High-Technologies Corporation).

(3) Resolution (L/S)

The minimum line width (nm) of a line pattern of a line-and-space pattern (1L1S) that was resolved at the optimum dose was taken as the resolution.

TABLE 1

| | Polymer (A) | | Acid generator (B) | | Acid diffusion controller (C) | | Solvent | | Sensitivity ($\mu$C/cm$^2$) | Resolution (nm) | Nano edge roughness (nm) |
|---|---|---|---|---|---|---|---|---|---|---|---|
| | Type | Amount (parts) | Type | Amount (parts) | Type | Amount (parts) | Type | Amount (parts) | | | |
| Composition Example 1 | A-1 | 100 | — | — | C-1 | 2 | D-1 D-2 | 1100 2500 | 33 | 70 | 10 |

TABLE 1-continued

| | Polymer (A) | | Acid generator (B) | | Acid diffusion controller (C) | | Solvent | | Sensitivity ($\mu C/cm^2$) | Resolution (nm) | Nano edge roughness (nm) |
|---|---|---|---|---|---|---|---|---|---|---|---|
| | Type | Amount (parts) | Type | Amount (parts) | Type | Amount (parts) | Type | Amount (parts) | | | |
| Composition Example 2 | A-2 | 100 | B-1 | 9 | C-1 | 2 | D-1 D-2 | 1100 2500 | 35 | 90 | 15 |
| Composition Example 3 | A-3 | 100 | B-1 | 9 | C-1 | 2 | D-1 D-2 | 1100 2500 | 35 | 90 | 18 |

As is clear from the results shown in Table 1, the radiation-sensitive resin composition of Composition Example 1 could form a chemically-amplified positive-tone resist film that exhibits high sensitivity to electron beams, exhibits low roughness, and can stably form an accurate fine pattern as compared with the radiation-sensitive resin compositions of Composition Comparative Examples 1 and 2.

The radiation-sensitive resin composition according to the embodiment of the invention exhibits excellent resolution when forming a line-and-space pattern, and exhibits low nano edge roughness. Therefore, the radiation-sensitive resin composition is useful when forming a fine pattern using electron beams, EUV, or X-rays. Accordingly, the radiation-sensitive resin composition may be very useful as a material for forming a chemically-amplified resist used to produce semiconductor devices that are expected to be further scaled down in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation-sensitive resin composition comprising:
a solvent; and
a polymer comprising:
  a repeating unit (i) shown by a formula (1);
  a repeating unit (ii) shown by a formula (4); and
  at least one repeating unit (iii) selected from a repeating unit shown by a formula (5) and a repeating unit shown by a formula (6), a content of the repeating unit (iii) in the polymer being 20 mol % or more based on a total amount of repeating units included in the polymer,

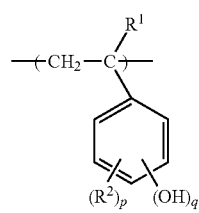

(1)

wherein p is an integer from 0 to 3, q is an integer from 1 to 3, a sum of p and q is equal to or less than 5, $R^1$ represents a hydrogen atom or a methyl group, each $R^2$ independently represents one of a linear or branched alkyl group having 1 to 12 carbon atoms, a linear or branched alkoxy group having 1 to 12 carbon atoms, and an alicyclic hydrocarbon group having 3 to 25 carbon atoms, and each $R^2$ is a same as or different from each other when p is 2 or 3,

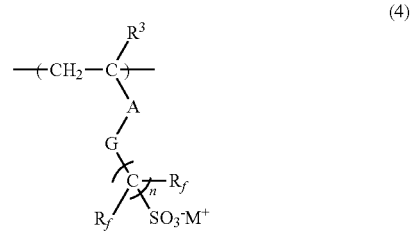

(4)

wherein $R^3$ represents a hydrogen atom, a fluorine atom, a methyl group, or a trifluoromethyl group, each $R_f$ independently represents one of a fluorine atom and a linear or branched perfluoroalkyl group having 1 to 10 carbon atoms, each $R_f$ is a same as or different from each other, A represents an ester bond or a single bond, G represents an alkylene group having 1 to 5 carbon atoms or a divalent alicyclic hydrocarbon group having 6 to 10 carbon atoms, $M^+$ represents a metal ion or a monovalent onium cation, and n is an integer from 1 to 8,

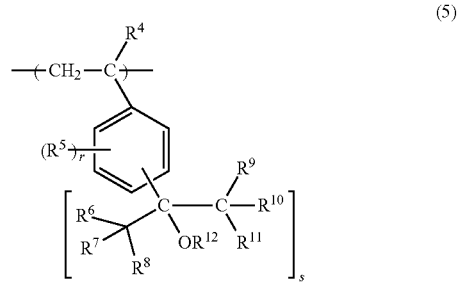

(5)

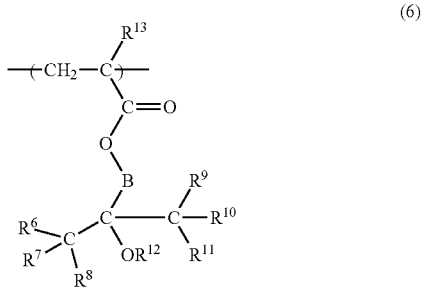

(6)

wherein r is an integer equal to or larger than 0, s is an integer equal to or larger than 1, a sum of r and s is equal to or less than 5, each of $R^6$ to $R^{11}$ represents a hydrogen atom or a fluorine atom and at least one of $R^6$ to $R^{11}$ represents a fluorine atom, $R^{12}$ represents a hydrogen atom or a linear or branched alkyl group having 1 to 12 carbon atoms, $R^4$ represents a hydrogen atom or a methyl group, each $R^5$ independently represents one of a linear or branched alkyl group having 1 to 12 carbon atoms, a linear or branched alkoxy group having 1 to 12 carbon atoms, and an alicyclic hydrocarbon group having 3 to 25 carbon atoms, each $R^5$ is a same as or different from each other when r is 2 or more, $R^{13}$ represents a hydrogen atom, a fluorine atom, a methyl group, or a trifluoromethyl group, and B represents a linear, branched, or cyclic divalent hydrocarbon group having 1 to 40 carbon atoms.

2. The radiation-sensitive resin composition according to claim 1, wherein the repeating unit (ii) is shown by a formula (4-1) or (4-2),

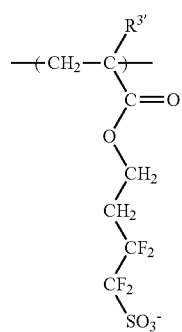

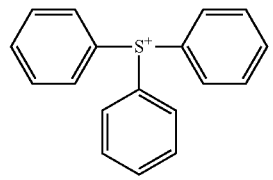

(4-1)

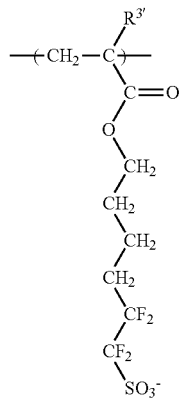

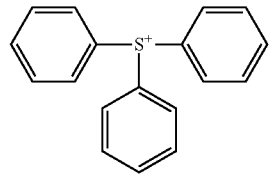

(4-2)

wherein $R^{3'}$ represents a hydrogen atom or a methyl group.

3. The radiation-sensitive resin composition according to claim 1, the polymer further comprising an acid-dissociable group-containing repeating unit shown by a formula (7),

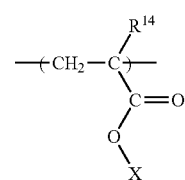

(7)

wherein $R^{14}$ represents a hydrogen atom, a methyl group, or a trifluoromethyl group, and X represents an acid-dissociable group including an alicyclic skeleton having 3 to 25 carbon atoms.

4. The radiation-sensitive resin composition according to claim 1, wherein a content of the repeating unit (i) in the polymer being 10 mol % or more based on a total amount of repeating units included in the polymer.

5. A polymer comprising:
a repeating unit (i) shown by a formula (1);
a repeating unit (ii) shown by a formula (4);
at least one repeating unit (iii) selected from a repeating unit shown by a formula (5) and a repeating unit shown by a formula (6), a content of the repeating unit (iii) in the polymer being 20 mol % or more based on a total amount of repeating units included in the polymer; and
an acid-dissociable group-containing repeating unit shown by a formula (7),
the polymer having a polystyrene-reduced weight average molecular weight determined by gel permeation chromatography of 3000 to 100,000,

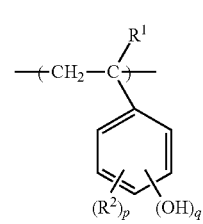

(1)

wherein p is an integer from 0 to 3, q is an integer from 1 to 3, a sum of p and q is equal to or less than 5, $R^1$ represents a hydrogen atom or a methyl group, each $R^2$ independently represents one of a linear or branched alkyl group having 1 to 12 carbon atoms, a linear or branched alkoxy group having 1 to 12 carbon atoms, and an alicyclic hydrocarbon group having 3 to 25 carbon atoms, and each $R^2$ is a same as or different from each other when p is 2 or 3,

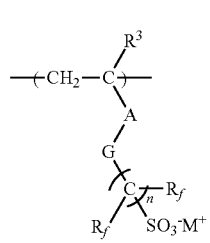

(4)

wherein $R^3$ represents a hydrogen atom, a fluorine atom, a methyl group, or a trifluoromethyl group, each $R_f$ independently represents one of a fluorine atom and a linear or branched perfluoroalkyl group having 1 to 10 carbon atoms, each $R_f$ is a same as or different from each other, A represents an ester bond or a single bond, G represents an alkylene group having 1 to 5 carbon atoms or a divalent alicyclic hydrocarbon group having 6 to 10 carbon atoms, $M^+$ represents a metal ion or a monovalent onium cation, and n is an integer from 1 to 8,

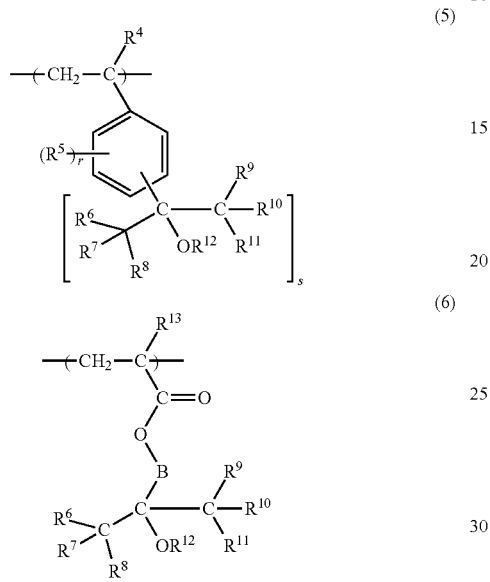

wherein r is an integer equal to or larger than 0, s is an integer equal to or larger than 1, a sum of r and s is equal to or less than 5, each of $R^6$ to $R^{11}$ represents a hydrogen atom or a fluorine atom and at least one of $R^6$ to $R^{11}$ represents a fluorine atom, $R^{12}$ represents a hydrogen atom or a linear or branched alkyl group having 1 to 12 carbon atoms, $R^4$ represents a hydrogen atom or a methyl group, each $R^5$ independently represents one of a linear or branched alkyl group having 1 to 12 carbon atoms, a linear or branched alkoxy group having 1 to 12 carbon atoms, and an alicyclic hydrocarbon group having 3 to 25 carbon atoms, each $R^5$ is a same as or different from each other when r is 2 or more, $R^{13}$ represents a hydrogen atom, a fluorine atom, a methyl group, or a trifluoromethyl group, and B represents a linear, branched, or cyclic divalent hydrocarbon group having 1 to 40 carbon atoms,

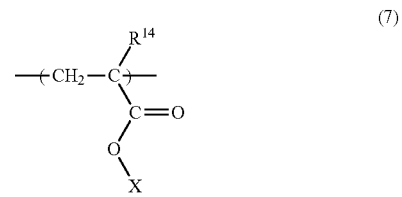

wherein $R^{14}$ represents a hydrogen atom, a methyl group, or a trifluoromethyl group, and X represents an acid-dissociable group including an alicyclic skeleton having 3 to 25 carbon atoms.

6. The polymer according to claim 5, wherein a content of the repeating unit (i) in the polymer being 10 mol % or more based on a total amount of repeating units included in the polymer.

* * * * *